United States Patent
Rullan et al.

(10) Patent No.: US 9,524,935 B2
(45) Date of Patent: Dec. 20, 2016

(54) FILLING CAVITIES IN AN INTEGRATED CIRCUIT AND RESULTING DEVICES

(71) Applicant: GLOBALFOUNDRIES Inc., Grand Cayman (KY)

(72) Inventors: Jonathan Lee Rullan, Clifton Park, NY (US); Sunil Kumar Singh, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/711,380

(22) Filed: May 13, 2015

(65) Prior Publication Data
US 2016/0336264 A1    Nov. 17, 2016

(51) Int. Cl.
| | |
|---|---|
| *H01L 23/522* | (2006.01) |
| *H01L 21/768* | (2006.01) |
| *H01L 23/528* | (2006.01) |
| *H01L 21/033* | (2006.01) |
| *H01L 21/3105* | (2006.01) |
| *H01L 21/288* | (2006.01) |
| *H01L 23/532* | (2006.01) |

(52) U.S. Cl.
CPC ......... *H01L 23/528* (2013.01); *H01L 21/0332* (2013.01); *H01L 21/2885* (2013.01); *H01L 21/31055* (2013.01); *H01L 21/7685* (2013.01); *H01L 21/76802* (2013.01); *H01L 21/76843* (2013.01); *H01L 21/76873* (2013.01); *H01L 21/76879* (2013.01); *H01L 23/5226* (2013.01); *H01L 23/53238* (2013.01)

(58) Field of Classification Search
CPC .. H01L 23/528; H01L 23/522; H01L 21/0332; H01L 21/76879; H01L 21/76802; H01L 21/76873; H01L 21/76843; H01L 21/31055; H01L 21/2885; H01L 21/7685; H01L 23/5226; H01L 23/53238; H01L 21/768

See application file for complete search history.

(56) References Cited

U.S. PATENT DOCUMENTS

| | | | |
|---|---|---|---|
| 7,470,616 B1 * | 12/2008 | Akinmade-Yusuff | H01L 21/76802 257/E23.145 |
| 7,695,897 B2 * | 4/2010 | Bucchignano .... | H01L 21/31144 216/58 |
| 7,829,454 B2 | 11/2010 | Suzuki | |
| 8,143,159 B2 * | 3/2012 | King ................. | H01L 21/76807 438/672 |
| 9,390,967 B2 * | 7/2016 | Lee .................... | H01L 21/7682 |
| 2011/0147341 A1 | 6/2011 | Sato et al. | |

* cited by examiner

*Primary Examiner* — Savitr Mulpuri
(74) *Attorney, Agent, or Firm* — Ditthavong & Steiner, P.C.

(57) ABSTRACT

A methodology enabling filling of high aspect ratio cavities, with no voids or gaps, in an IC device and the resulting device are disclosed. Embodiments include providing active area and/or gate contacts in a first ILD; forming selective protective caps on upper surfaces of the contacts; forming a second ILD on upper surfaces of the protective caps and on an upper surface of the first ILD; forming a hard-mask stack on the second ILD; forming, in the second ILD and hard-mask stack, cavities exposing one or more protective caps; removing selective layers in the stack to decrease depths of the cavities; and filling the cavities with a metal layer, wherein the metal layer in one or more cavities connects to an upper surface of the one or more exposed protective caps.

13 Claims, 5 Drawing Sheets

Background

Background

Background

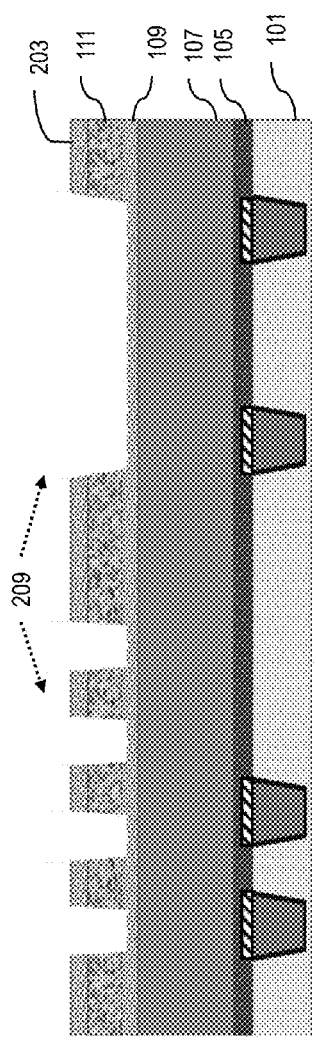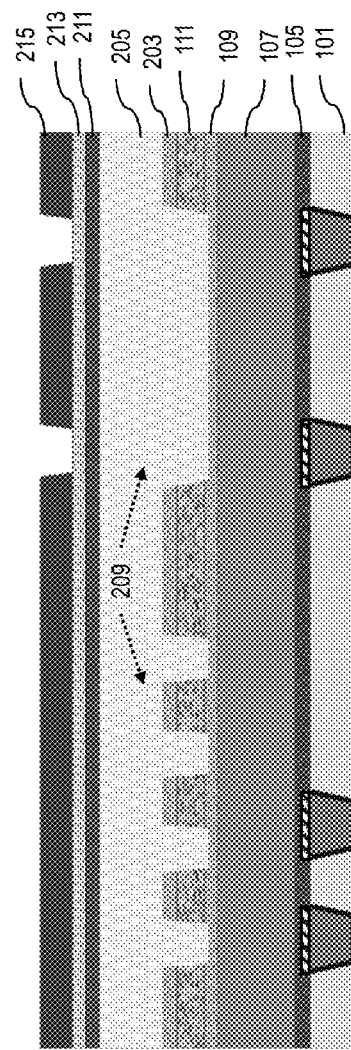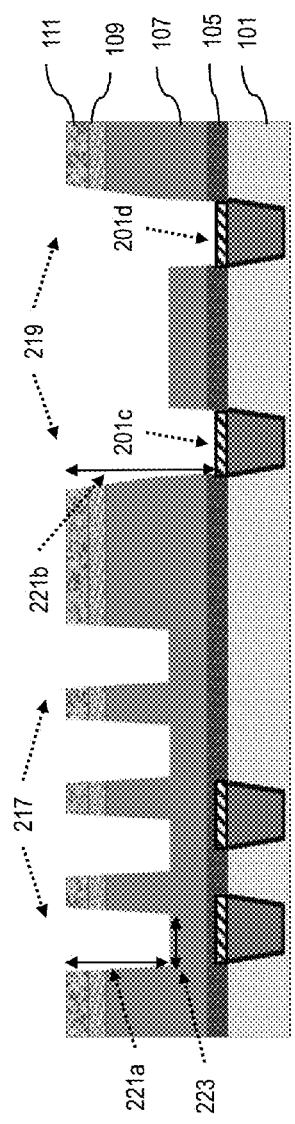
FIG. 2D
FIG. 2E
FIG. 2F

FILLING CAVITIES IN AN INTEGRATED CIRCUIT AND RESULTING DEVICES

TECHNICAL FIELD

The present disclosure relates generally to designing and fabricating integrated circuit (IC) devices. The present disclosure is applicable to filling cavities in an IC device without having voids or gaps in 22 nanometer technology nodes and beyond.

BACKGROUND

Generally, in the fabrication of an IC device, photolithographic processes may be utilized to print/pattern cavities, trenches, and/or recessed-areas for creating various devices, elements, and circuits. Different types of cavities may be formed at different stages of the fabrication process. For instance, the cavities may have different shapes, depths and/or sizes and may be created in different regions of a substrate. For example, a cavity intended to form a contact may have one size and aspect ratio (e.g., depth to width ratio), may be at a certain location in the substrate, and may be filled with a particular material such as tungsten (W), whereas trenches for metal lines may have a different size and aspect ratio and may be filled with a different material such as copper (Cu). The metal line trenches or channels in a metal layer may be filled with Cu for interconnecting different devices in the IC whereas a shallow trench isolation (STI) region may be filled with an oxide for electrically isolating various devices from each other. In the semiconductor industry, advanced technologies are used to design and manufacture smaller IC devices that may include circuit elements (e.g., transistor, interconnecting wires, vias, etc.) with smaller geometries. However, in smaller IC devices, the cavities that are to be filled with different materials may also shrink, which may present various challenges. For example, a trench filled with a material (e.g., Cu) may be filled such that void spots/areas may develop, which may be due insufficient/irregular filling of the material. The voids may degrade interconnectivities between various layers or elements in the IC device and cause performance or reliability issues. The voids may, for instance, be due to a high aspect ratio of a trench (e.g., too deep) where the filling material may not fully fill the trench.

FIG. 1A is a cross sectional diagram of various layers in an example IC device. FIG. 1A illustrates stack 100 including an interlayer dielectric (ILD) 101 over a silicon (Si) substrate (not shown for illustrative convenience), active area and gate contacts (e.g., W) 103a through 103d, an etch stop layer 105, another ILD 107, a dielectric hard-mask (DHM) layer 109 (such as silicon oxynitride (SiON)), a metal hard-mask (MHM) layer 111 (e.g., titanium nitride (TiN)), and a metal (e.g., Cu) layer 113 formed on upper surface of the MHM layer 111. Additionally, the metal layer may fill cavities/trenches 115 and 117 (e.g., via or metal line trenches) that may have been formed by various IC manufacturing (e.g., litho-etch) processes. A thin barrier/seed layer 119 may be formed in the cavities, prior to filling with metal.

FIGS. 1B and 1C illustrate cross-sectional views of structures in an example IC device. In FIG. 1B, image 121 includes a trench 115, which is filled with a material (e.g., Cu); however, there is a void 123 that may be due to insufficient filling material. Also, FIG. 1C depicts image 125 that illustrates a different view of the void 123.

As illustrated, different cavities/trenches (e.g., 115 or 117) may be at different depths yielding different aspect ratios. In instances of a deep trench (e.g., high aspect ratio), it is possible that the trench may not be completely filled with an intended material, wherein voids or gaps may exist. As noted, such voids or gaps may contribute to performance or reliability issues in an IC device.

A need therefore exists for a methodology enabling filling of high aspect ratio cavities, with no voids or gaps, in an IC device and the resulting device.

SUMMARY

An aspect of the present disclosure is an IC device that includes a decreased aspect ratio of cavities in a substrate, wherein the cavities may be filled with respective materials and without voids or gaps in the filling materials.

Another aspect of the present disclosure is a method for decreasing aspect ratio of cavities in a substrate, wherein the cavities may be filled with respective materials and without voids or gaps in the filling materials.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including providing active area and/or gate contacts in a first ILD; forming selective protective caps on upper surfaces of the contacts; forming a second ILD on upper surfaces of the protective caps and on an upper surface of the first ILD; forming a hard-mask stack on the second ILD; forming, in the second ILD and hard-mask stack, cavities exposing one or more protective caps; removing selective layers in the stack to decrease depths of the cavities; and filling the cavities with a metal layer, wherein the metal layer in one or more cavities connects to an upper surface of the one or more exposed protective caps.

One aspect includes performing chemical mechanical polishing (CMP) prior to forming the selective protective caps. Another aspect includes forming an etch stop layer prior to forming the second ILD.

In one aspect, the forming of the hard-mask stack includes forming a first dielectric hard-mask (DHM1) layer, a metal hard-mask (MHM) layer, a second dielectric hard-mask (DHM2) layer, a spin-on hard-mask (SOH) layer, and an antireflective coating (ARC) hard-mask layer.

In some aspects, the selective layers include the MHM layer, the DHM2 layer, the SOH layer, and the ARC layer.

In another aspect, the method includes conformally forming, prior to forming the metal layer, a barrier metal/seed layer on exposed surfaces of the DHM1 and ILD layers. In one aspect, the method includes removing an upper portion of the one or more exposed protective caps.

In some aspects, the MHM layer is removed at a faster rate than the upper portion of the one or more exposed protective caps. In another aspect, the method includes performing CMP down to an upper surface of the second ILD subsequent to filling with the metal layer. In one aspect, the protective caps comprise ruthenium caps. In another aspect, the contacts are cavities filled with tungsten.

In another aspect, the cavities include interconnecting vias and trenches.

In one aspect, the metal includes copper, and the method further includes filling the cavities with the copper by electrochemical plating (ECP).

According to the present disclosure, some technical effects may be achieved in part by a device including active area and/or gate contacts in a first ILD; selective protective caps on upper surfaces of the contacts; a second ILD on upper surfaces of the protective caps and on an upper surface of the first ILD; and vias through the second ILD down to the protective caps.

In one aspect, the device includes metal line trenches in the second ILD.

In another aspect, the device includes an etch stop layer under the second ILD. In one aspect, the protective caps include ruthenium.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 2I schematically illustrate a process flow for reducing aspect ratios of cavities in an IC device and enabling defect-free filling of the cavities, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of voids and irregular gaps in cavities in an IC device attendant upon filling the cavities with respective materials. The present disclosure addresses and solves such problems, for instance, by, inter alia, removing one or more layers of materials in the IC device to reduce the aspect ratio (e.g., depth) of cavities in a substrate so that the cavities may be filled with respective materials and without voids or gaps in the filling.

FIGS. 2A through 2I schematically illustrate a process flow for reducing aspect ratios of cavities in an IC device and enabling defect-free filling of the cavities, in accordance with an exemplary embodiment.

Figure 1A:
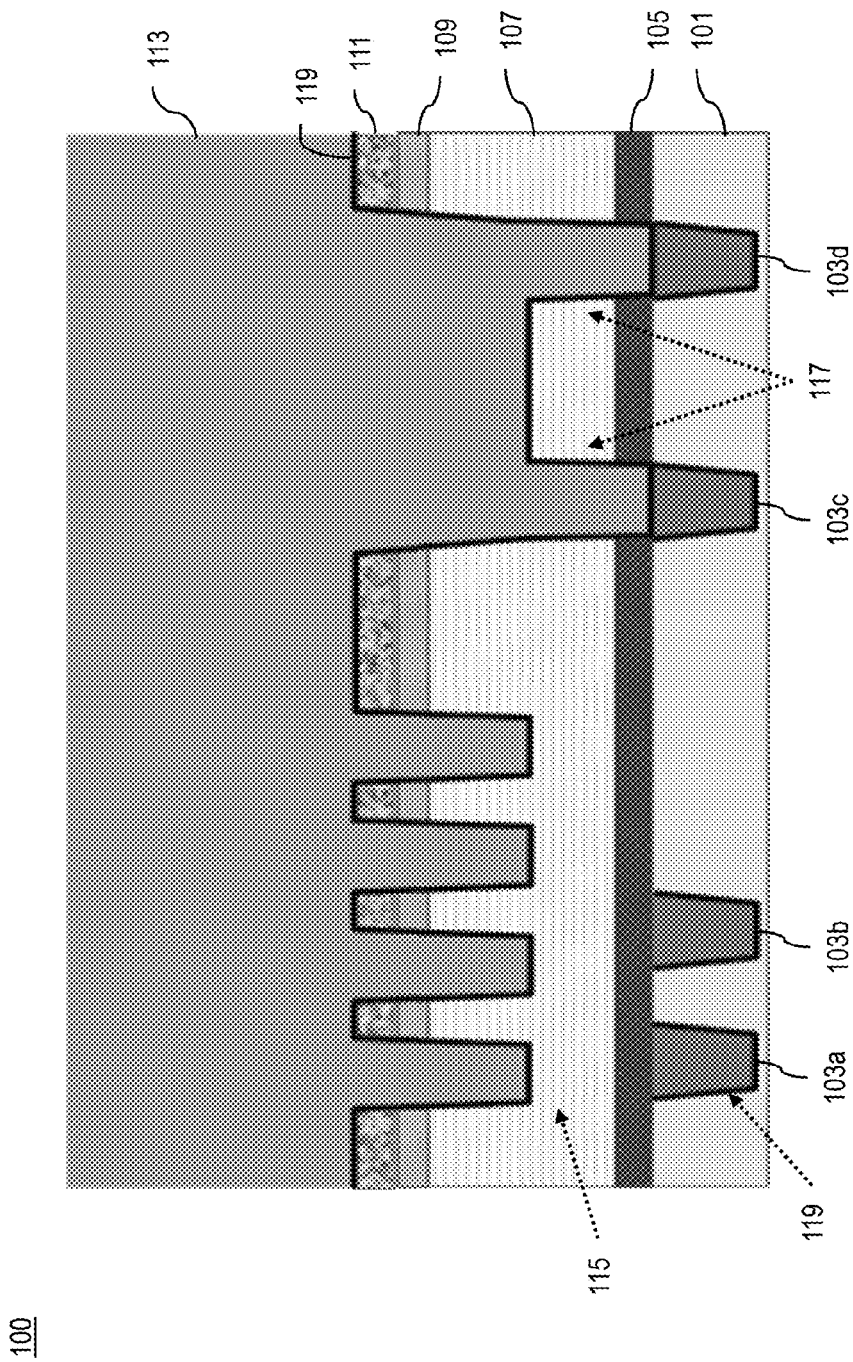
FIG. 1A is a cross-sectional diagram of various layers in an example IC device.
Figure 1C:
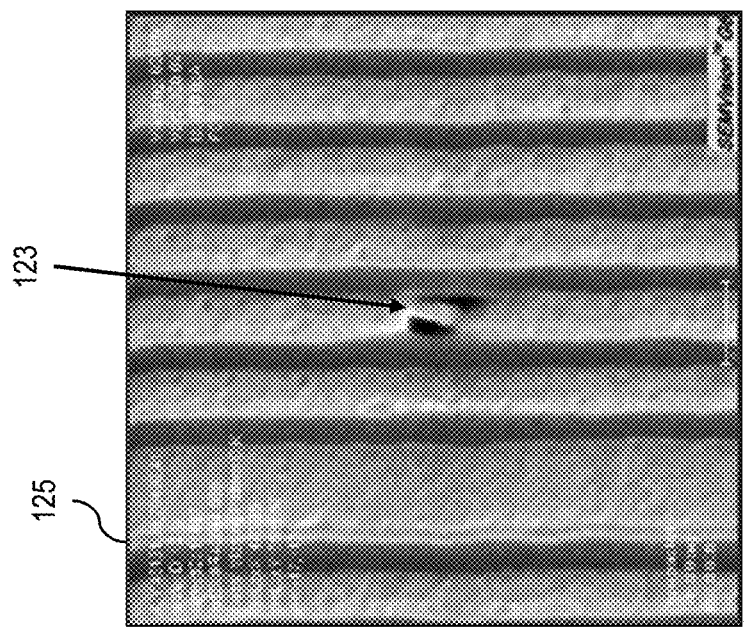
FIGS. 1B and 1C illustrate cross-sectional views of structures with voids in an example IC device.
Figure 1B:
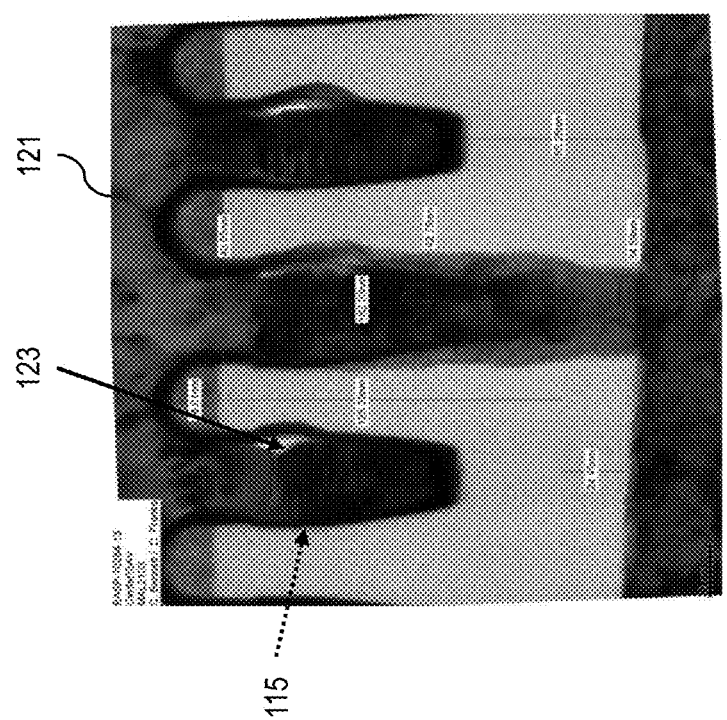
Figure 2A:
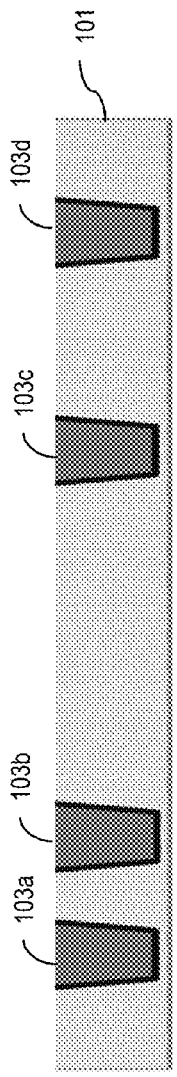
Figure 2B:
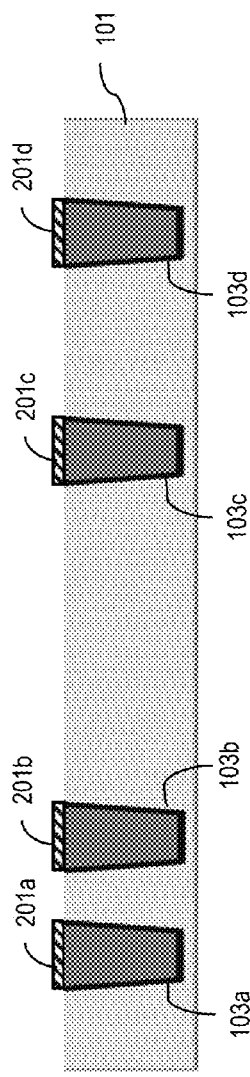
Figure 2C:
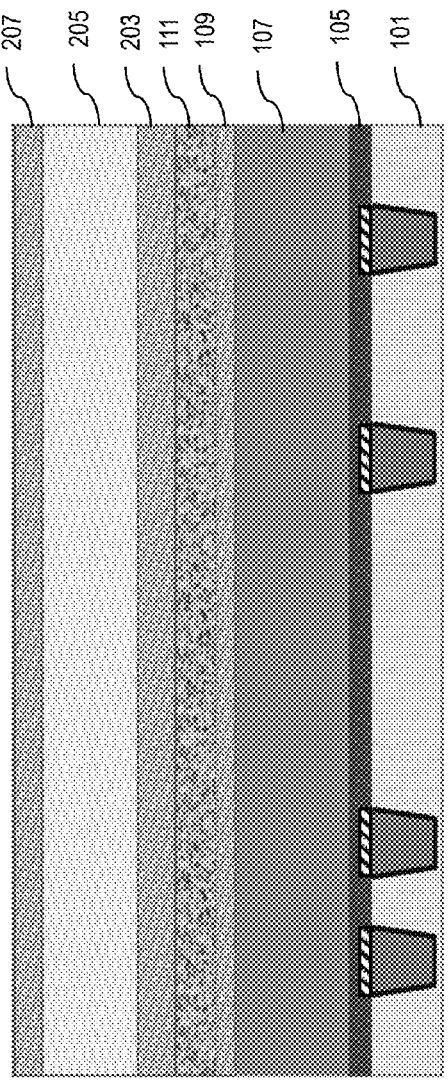

FIG. 2A illustrates the ILD 101 including the active area and gate contacts 103a through 103d that may be formed of a material such as W. After planarizing (e.g., by a CMP process) the contacts down to the upper surface of the ILD 101, as illustrated in FIG. 2B, ruthenium (Ru) protective caps 201a through 201d may be selectively deposited on the upper surfaces of the W contacts 103a through 103d. The deposition of the Ru caps 201a through 201d may be by use of a thermal chemical vapor deposition process. In FIG. 2C, an etch stop layer 105 is formed on the upper surface of the ILD 101 and upper surfaces of the Ru caps 201a through 201d. An ILD layer 107 (e.g., a low-k dielectric material such as silicon oxycarbonitride) is then formed. Metal line trenches and vias will be formed in and through the ILD layer 107. A DHM1 layer 109, a MHM layer 111, a second DHM (DHM2) layer 203, a SOH layer 205, and an ARC layer (e.g., SiON) 207 for etch transfer and reflection control are then formed consecutively over the ILD layer 107.

In FIG. 2D, various available IC fabrication processes (e.g., litho-etch double patterning) may be utilized to create cavities 209 for metal line trench patterning. Then the SOH layer 205 and ARC hard-mask layer 207 may be removed. In FIG. 2E, another SOH layer 205 may be deposited in the cavities 209 and on the upper surfaces of the remaining sections of the DHM2 layer 203. Additional layers, e.g., a SiON layer 211; a bottom-antireflective-coating (BARC) layer 213, and a photoresist layer 215, are, respectively, formed on the upper surface of the SOH layer 205 for via patterning.

In FIG. 2F, various IC fabrication processes may be utilized to create cavities 217 and 219, wherein the cavities 217 (e.g., metal line trenches) may extend into the ILD layer 107. The cavities 219 (e.g., vias) may extend deeper, through the ILD layer 107, down to and exposing upper surfaces of the Ru caps 201c and 201d. During the full etch of metal line trenches 217 and vias 219, the remaining sections of the DMH2 layer 203, SOH layer 205, SiON layer 211, BARC layer 213, and photoresist 215 are removed leaving sections of the MHM layer 111 on top of the stack. As illustrated, a cavity 217 may be at a depth of 221a and at a width of 223. Similarly, a cavity 219 may be associated with a depth of 221b and a width similar to width 223.

Figure 2G:
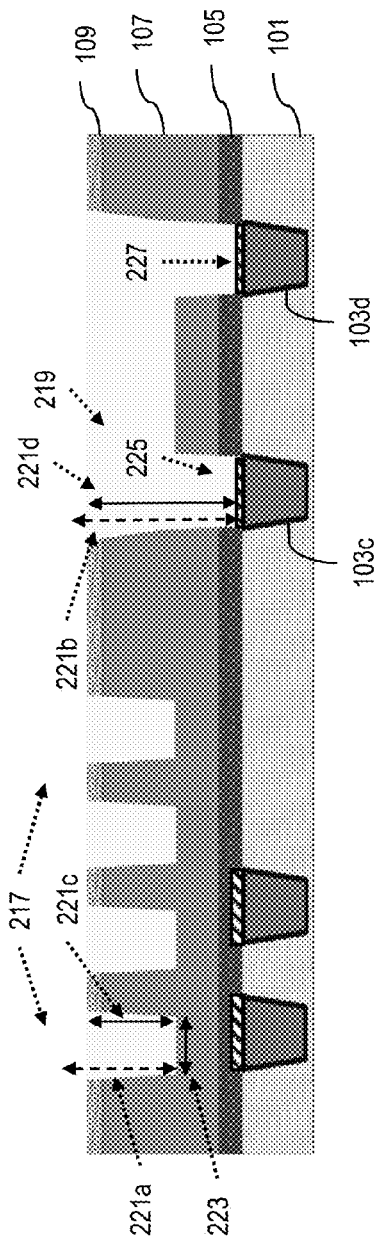
Figure 2H:
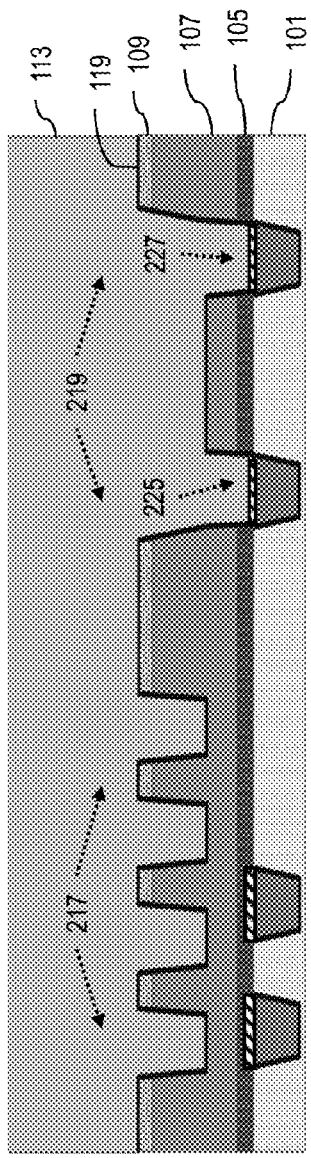
Figure 2I:
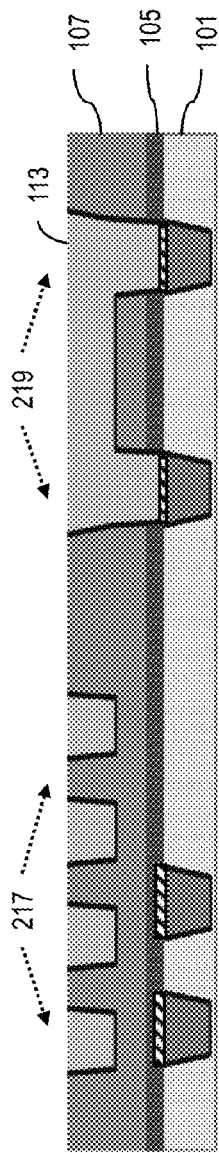

In FIG. 2G, various IC fabrication processes (e.g., wet clean) may be utilized to etch and remove remaining sections of the MHM layer 111 and an upper portion of each of the Ru caps 201c and 201d leaving partial Ru caps 225 and 227. It is noted that chemicals used in the etching process may etch the MHM/TiN layer 111 at a faster rate (e.g., 320 nanometer/minute) than the Ru caps 201c and 201d (e.g., less than one nanometer/minute); therefore, even after etching away the TiN layer 111, the partial Ru caps 225 and 227 still remain to protect the W contacts 103c and 103d. As illustrated, removal of the TiN layer 111 of FIG. 2F may decrease the depth of a cavity 217 from 221a to 221c, which may decrease the aspect ratio for that cavity by a percentage (e.g., 17%). Similarly, the depth of a cavity 219 may decrease from the depth of 221b to 221d, which may decrease the aspect ratio for that cavity by an associated percentage (e.g., 11%). In FIG. 2H, a thin barrier metal/seed layer 119 is formed on the upper surface of the remaining sections of the DHM1 layer 109 as well as in the cavities 217 and 219 including sidewalls therein; however, the upper surfaces of the partial Ru caps 225 and 227 remain exposed and without barrier metal/seed layer 119 on their upper surfaces. Next, a metal layer 113 is formed in the cavities/trenches 217 and 219 on the upper surface of the barrier metal/seed layer 119 by electrochemical plating (ECP). The metal layer 113 may form a direct contact with the partial Ru caps 225 and 227. In FIG. 2I, an upper portion of the metal layer 113 and remaining sections of the DHM1 layer 109 are removed by planarization (e.g., CMP) down to an upper surface of the ILD layer 107 leaving the cavities 217 and 219 filled with remaining portions of the metal layer 113.

It is noted that other typical materials and IC fabrication processes may be utilized. The process may be used for all metal layers and contact layers, where the via bottom may be W or Cu.

The embodiments of the present disclosure can achieve several technical effects, including reduced aspect ratio of cavities in a substrate for enabling defect-free filling of the cavities with respective materials as well as protection of the via bottoms from wet TiN removal. Further, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM memory cells (e.g., liquid crystal display (LCD) drivers, synchronous random access memories (SRAM), digital processors, etc.), particularly for 22 nm technology node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing active area and/or gate contacts in a first interlayer dielectric (ILD);
forming selective protective caps on upper surfaces of the contacts;
forming a second ILD on upper surfaces of the protective caps and on an upper surface of the first ILD;
forming a hard-mask stack on the second ILD;
forming, in the second ILD and hard-mask stack, cavities exposing one or more protective caps;
removing selective layers in the stack to decrease depths of the cavities; and
filling the cavities with a metal layer, wherein the metal layer in one or more cavities connects to an upper surface of the one or more exposed protective caps,
wherein the forming of the hard-mask stack comprises:
forming a first dielectric hard-mask (DHM1) layer, a metal hard-mask (MHM) layer, a second dielectric hard-mask (DHM2) layer, a spin-on hard-mask (SOH) layer, and an antireflective coating (ARC) hard-mask layer; and
wherein the protective caps comprise ruthenium caps and the contacts are cavities filled with tungsten.

2. The method according to claim 1, comprising performing chemical mechanical polishing (CMP) prior to forming the selective protective caps.

3. The method according to claim 1, comprising forming an etch stop layer prior to forming the second ILD.

4. The method according to claim 1, wherein the selective layers include the MHM layer, the DHM2 layer, the SOH layer, and the ARC layer.

5. The method according to claim 1, further comprising:
conformally forming, prior to forming the metal layer, a barrier metal/seed layer on exposed surfaces of the DHM1 and ILD layers.

6. The method according to claim 1, further comprising:
removing an upper portion of the one or more exposed protective caps.

7. The method according to claim 6, wherein the MHM layer is removed at a faster rate than the upper portion of the one or more exposed protective caps.

8. The method according to claim 1, comprising performing CMP down to an upper surface of the second ILD subsequent to filling with the metal layer.

9. The method according to claim 1, wherein the cavities include interconnecting vias and trenches.

10. The method according to claim 1, wherein the metal comprises copper, the method further comprising filling the cavities with the copper by electrochemical plating (ECP).

11. A method comprising:
providing active area and/or gate contacts in a first interlayer dielectric (ILD);
forming selective protective caps on upper surfaces of the contacts;
forming a second ILD on upper surfaces of the protective caps and on an upper surface of the first ILD;
forming a hard-mask stack on the second ILD, wherein the hard-mask includes a first dielectric hard-mask (DHM1) layer, a metal hard-mask (MHM) layer, a second DHM dielectric hard-mask (DHM2) layer, a spin-on hard-mask (SOH) layer, and an antireflective coating (ARC) hard-mask layer;
forming, in the second ILD and hard-mask stack, cavities exposing one or more protective caps;
removing selective layers in the stack to decrease depths of the cavities, wherein the selective layers include the MHM layer, the DHM2 layer, the SOH layer, and the ARC layer;
filling the cavities with a metal layer, wherein the metal layer in one or more cavities connects to an upper surface of the one or more exposed protective caps; and
conformally forming, prior to forming the metal layer, a barrier metal/seed layer on exposed surfaces of the DHM1 and ILD layers,
wherein the protective caps comprise ruthenium caps, the contacts are cavities filled with tungsten.

12. The method according to claim 11, further comprising:
removing an upper portion of the one or more exposed protective caps.

13. The method according to claim 11, wherein the protective caps comprise ruthenium caps, the contacts are cavities filled with tungsten, and wherein the MHM layer is removed at a faster rate than the upper portion of the one or more exposed protective caps.

* * * * *